(12) United States Patent
Taboryski et al.

(10) Patent No.: US 9,475,214 B2
(45) Date of Patent: Oct. 25, 2016

(54) SILANE BASED COATING OF ALUMINIUM MOLD

(71) Applicant: Danmarks Tekniske Universitet, Kgs. Lyngby (DK)

(72) Inventors: Rafael Taboryski, Bagsværd (DK); Jiri Cech, Virum (DK)

(73) Assignee: DANMARKS TEKNISKE UNIVERSITET, Kgs. Lyngby (DK)

( * ) Notice: Subject to any disclaimer, the term of this patent is extended or adjusted under 35 U.S.C. 154(b) by 0 days.

(21) Appl. No.: 14/383,431

(22) PCT Filed: Mar. 8, 2013

(86) PCT No.: PCT/EP2013/054779
§ 371 (c)(1),
(2) Date: Sep. 5, 2014

(87) PCT Pub. No.: WO2013/132079
PCT Pub. Date: Sep. 12, 2013

(65) Prior Publication Data
US 2015/0021826 A1 Jan. 22, 2015

Related U.S. Application Data

(60) Provisional application No. 61/608,247, filed on Mar. 8, 2012.

(30) Foreign Application Priority Data

Mar. 8, 2012 (EP) .................................... 12158587

(51) Int. Cl.
*B29C 33/64* (2006.01)
*B29C 33/56* (2006.01)
(Continued)

(52) U.S. Cl.
CPC ............... *B29C 33/64* (2013.01); *B29C 33/56* (2013.01); *B29C 33/58* (2013.01); *B29C 45/26* (2013.01);
(Continued)

(58) Field of Classification Search
CPC ...................................................... B29C 33/64
See application file for complete search history.

(56) References Cited

U.S. PATENT DOCUMENTS 4,536,416 A 8/1985 Ponjee et al.
4,775,554 A 10/1988 Ponjee
(Continued)

FOREIGN PATENT DOCUMENTS

EP 0773093 A1 5/1997

OTHER PUBLICATIONS

International Preliminary Report on Patentability received for PCT Patent Application No. PCT/EP2013/054779, mailed on Jun. 30, 2014, 9 pages.
International Search Report & Written Opinion received for PCT Patent Application No. PCT/EP2013/054779, mailed on Jul. 18, 2013, 13 pages.
(Continued)

*Primary Examiner* — Jill Heitbrink
(74) *Attorney, Agent, or Firm* — Morrison & Foerster LLP

(57) ABSTRACT

A method of preparing an aluminum mold for injection molding is provided, the method comprises the steps of providing an aluminum mold having a least one surface, subjecting the at least one surface to a gas or liquid phase silane to thereby form an anti-stiction coating, the anti-stiction coating comprising a chemically bonded monolayer of silane compounds on the at least one surface wherein the silane is a halogenated silane. At least one surface coated with the anti-stiction coating may be configured to withstand an injection molding process at a pressure above 100 MPa. Furthermore, a mold having at least one closed cavity is provided, at least one surface of the at least one cavity being an aluminium surface coated with a silane based coating layer. The resistance of the coated aluminium mold is significantly improved by applying a silane-based coating layer.

16 Claims, 8 Drawing Sheets

(51) Int. Cl.
    *C23C 16/40*         (2006.01)
    *C23C 16/455*      (2006.01)
    *B29C 33/58*        (2006.01)
    *B29C 45/26*        (2006.01)
    *B29C 45/34*        (2006.01)
    *B29C 45/40*        (2006.01)
    *C23C 14/12*        (2006.01)
    *B29C 33/42*        (2006.01)
    *B29K 101/12*      (2006.01)

(52) U.S. Cl.
    CPC .......... *B29C 45/34* (2013.01); *B29C 45/4005* (2013.01); *C23C 14/12* (2013.01); *C23C 16/401* (2013.01); *C23C 16/45525* (2013.01); *C23C 16/45555* (2013.01); *B29C 33/424* (2013.01); *B29K 2101/12* (2013.01); *B29K 2883/00* (2013.01); *B29K 2905/02* (2013.01)

(56) References Cited

U.S. PATENT DOCUMENTS

| | | | |
|---|---|---|---|
| 5,549,855 A * | 8/1996 | Nakanishi | B29C 33/3835 264/2.1 |
| 6,852,266 B2 * | 2/2005 | Robinson | B06B 3/02 264/338 |
| 2003/0080458 A1 | 5/2003 | Heilig et al. | |
| 2005/0039618 A1 | 2/2005 | Heidari et al. | |
| 2005/0271893 A1 | 12/2005 | Kobrin et al. | |
| 2007/0191761 A1 * | 8/2007 | Boone | A61B 17/205 604/46 |
| 2008/0290249 A1 | 11/2008 | Hidaka et al. | |
| 2010/0239783 A1 | 9/2010 | Mao et al. | |
| 2010/0243458 A1 | 9/2010 | Kojima et al. | |
| 2011/0139959 A1 | 6/2011 | Lu et al. | |

OTHER PUBLICATIONS

Wu, S. "Calculation of Interfacial Tension in Polymer Systems", Journal of Polymer Science: Part C, No. 34, 1971, pp. 19-30.

\* cited by examiner

SILANE BASED COATING OF ALUMINIUM MOLD

CROSS REFERENCE TO RELATED APPLICATIONS

This application is a U.S. National Phase patent application of PCT/EP2013/054779, filed on Mar. 8, 2013, which claims priority to European Patent Application No. 12158587.1, filed on Mar. 8, 2012, and U.S. Provisional Application No. 61/608,247, filed on Mar. 8, 2012, the entire contents of which are incorporated herein by reference.

FIELD OF INVENTION

The present invention relates to molds and in particular to molds being formed in an aluminium material and coated with a silane-based coating. such as to injection molding molds.

BACKGROUND OF THE INVENTION

Previously, aluminium was not widely used for tool making, however, due to improvements in the aluminium properties, and particularly the mechanical properties of aluminium, it is now well known to use aluminium for tool making. In molding, and especially in plastic and polymer molding, aluminium has been widely used for prototyping molds as the molds are cheaper and faster to manufacture than steel molds, and further weigh much less making them suitable for prototype molding.

The aluminium molds are typically coated by chrome or nickel plating, or they may be anodized. These coatings protect the aluminium molds against both corrosion and wear and tear. Furthermore, the coatings increase the abrasion resistance of the molds. Also, a PVD process may be used to deposit for example TiN, TiC, etc. Steel is still the predominant material for forming molds designed for high volume production, and the steel molds are typically coated with tungsten carbide or silicon nitride, typically in layers of 5 μm to 200 μm.

To obtain the corrosion and abrasion resistance necessary for the aluminium molds even in prototyping molds, an efficient coating needs to be provided. The typical coating layer thickness of the coatings as mentioned above, ranges from 5 μm to 200 μm, where PVD coatings may allow for the thinnest coatings, though also being a very complicated process.

These thick coatings may act as thermal barriers, and may, thus, limit the heat flux through the mold surfaces, slowing the heat exchange and prolonging cycle time. Furthermore, these coatings typically have different coefficient of thermal expansion compared to the bulk of the mold, which results in stressing and straining of the interface which may result in failures, such as delamination or flaking during thermal stressing of the mold. Additionally, if the coating is damaged, repair of the surface is difficult as the coating is neither readily repaired nor readily removable, so that often the mold will be discarded and not repaired.

It has been known to use aluminum molds for stamping, such as for imprinting, such as for nano-imprinting. and it is known e.g. from US 2005/0039618 to use an aluminium stamp for transferring a pattern in nano-scale, wherein the aluminum stamp has a silane based monomolecular anti-stiction coating. However, as the stamping process is much less harsh to the molds than e.g. injection molding, typically as disclosed in e.g. US 2003/0080458, aluminum molds for molding of liquid materials such as PUR have, when they have been employed, used a brushing or spraying technique to apply anti-stiction coating in between molding cycles. Such techniques may be adequate for some objects, however, the precision of the layer thickness, etc. will be insufficient for other purposes and furthermore also it may be a challenge to ensure that the mold is tightly closed during molding when a release agent is applied by brushing or spraying.

Furthermore, US2011/0139959 discloses a method of preparing an aluminium mold by providing a chemically bonded silane based anti-stiction coating effective for molding of thermoplastic parts. However, even this silane based coating does not result in a significantly higher lifetime for the mold, and frequent re-coating of the mold is required to ensure the anti-stiction properties of the mold.

Thus, there is a need for an improved coating for aluminium molds.

SUMMARY OF THE INVENTION

It is therefore an object of the present invention to provide a mold with a coating overcoming one or more of the disadvantages of the prior art.

According to the invention, a mold having at least one cavity is provided, at least one surface of the at least one cavity being an aluminium surface coated with a silane based coating layer. The mold may be at least partly formed in an aluminium material comprising at least 50 wt % aluminium. Preferably, the cavity is configured to receive a molding material.

In another aspect of the present invention a mold defining at least one cavity and being configured to receive a molding material is provided. The mold is being at least partly formed in an aluminium material comprising at least 50 wt % aluminium. At least one surface of the cavity may be an aluminium surface coated with a silane based coating layer.

In a further aspect of the present invention, a method of preparing a mold, such as an aluminum mold, for injection molding is provided. The method comprises the steps of providing an aluminum mold having a least one surface, subjecting the at least one surface to a gas or liquid phase silane to thereby form an anti-stiction coating, the anti-stiction coating comprising a chemically or covalently bonded monolayer of silane compounds on the at least one surface. The at least one surface coated with the anti-stiction coating may be configured to withstand an injection molding process at a pressure above 100 MPa. The silane may be a halogenated silane.

In a still further aspect of the present invention, an aluminum mold having a least one surface is provided, the at least one surface having an anti-stiction coating. The anti-stiction coating comprises a chemically or covalently bonded monolayer of silane compounds on the at least one surface. The at least one surface coated with the anti-stiction coating may be configured to withstand a molding process at a pressure above 100 MPa. The silane may be a halogenated silane.

It has surprisingly been found by the present inventors, that by providing an anti-stiction coating being chemically bonded to the at least one surface of the mold and comprising a halogenated silane, the anti-stiction properties for aluminum molds during e.g. injection molding are significantly increased.

It is a further advantage of the anti-stiction coating that no residues of the anti-stiction coating is transferred to molded objects.

It is an advantage of providing at least one surface of the mold with a silane based coating in that this improves the anti-stiction properties of the mold and thus improve the ability of molded objects or parts to be released from the mold after hardening. The anti-stiction coating thus improves the releasability of objects from the mold, and reduces stiction. It is a further advantage of the present invention that no, substantially no, or only a small amount of, release agents is necessary in the molding process when the mold formed in the aluminium material is coated with a halogenated silane based coating. Thus, the silane coating may be used for materials were contamination of the molding material from a release agent is undesirable and may furthermore allow for molding and demolding of structures which would otherwise be difficult to mold.

It has furthermore surprisingly been found by the present inventor, that the silane coating is substantially unaffected by the molding process, and thus that the fatigue and wear resistance of the coated aluminium mold is significantly improved by applying a silane-based anti-stiction coating, and especially a halogenated silane based anti-stiction coating.

It is a further advantage of the proposed anti-stiction coating that the coating may be conform.

It is envisaged that also other mold materials may be coated with the anti-stiction coating according to the present invention, including nickel, chrome, titanium, platinum, copper, steel, stainless steel, cast iron or any combination or alloy thereof.

The silane may be a halogenated silane, and the halogenated silane may be a fluoro silane, a perfluorosilane, a chloro silane, a perchloro silane, a bromine silane or an iodine silane, or any combination thereof. In one embodiment, the silane may be a silane having a trichlorosilane.

More specifically, the silane may be perfluorodecyltrichlorosilanes (FDTS), undecenyl trichlorosilanes (UTS), vinyl trichlorosilanes (VTS), decyl trichlorosilanes (DTS), octadecyltrichlorosilanes (OTS), dimethyldichlorosilanes (DDMS), dodecenyltricholrosi lanes (DDTS), fluorotetrahydrooctyldimefhylchlorosilanes (FOTS), perfluorooctyldimethylchlorosilanes aminopropylmefhoxysilanes (APTMS), fluoropropylmethyldichlorosilanes, perfluorodecyldimethylchlorosilanes, Preferably, the anti-stiction coating is a thin layer, such as an anti-stiction coating having a thickness below 1 μm, such as having a thickness between 1 Å and 1 μm, such as a thickness below 100 nm, such as between 1 Å and 100 nm, such as between 1 Å and 80 nm, such as between 1 Å and 50 nm, such as between 1 Å and 40 nm, such as between 1 Å and 10 nm, or the anti-stiction coating may have a thickness between 100 Å and 10 nm, such as between 100 Å and 1 nm, or the anti-stiction coating may have a thickness between 1 nm and 10 nm, such as between 1 nm and 40 nm.

In one embodiment, the anti-stiction coating is a mono layer coating, or a monomolecular coating layer. The anti-stiction coating may consist of the silane coating as chemically bonded to the mold surface.

The halogenide content on the at least one coated surface may be at least 30%, such as at least 25%, such as at least 20%. For example, the fluoride content on the at least one coated surface may be at least 30%, such as at least 25%, such as at least 20%. Typically, the halogenide content on the at least one coated surface is evaluated immediately after coating and as atomic percentage, e.g. at %.

During molding, a number of molding cycles are performed, including injecting molding material, such as a liquid polymer, such as a hot liquid polymer, into the mold, hardening the molding material, such as by cooling, and subsequently ejecting the molded object or part. Surprisingly it has been found that the coating lifetime may exceed 500 cycles, and thus coated mold, or the mold having at least one surface having an anti-stiction coating, may be used for more than 500 cycles before the coating need to be renewed or restored. The anti-stiction coating may have a lifetime of more than 500 cycles, such as more than 1000 cycles, such as more than 2500, more than 3500, such as more than 5000, such as more than 7500, such as more than 10,000, such as more than 12.000, such as more than 15,000, such as more than 20,000 cycles. Thus the anti-stiction coating may have a lifetime between 500 and 15,000 cycles, such as between 5,000 and 15,000 cycles.

It is an advantage to have a long lifetime for aluminum molds for injection molding in that a large volumes may be produced at high speed with minimum downtime due to maintenance.

It has been found by the present inventors that the halogenide content on the at least one coated surface may be only slightly reduced during pluralities of molding cycles. For example, the halogenide content, such as the fluoride content, on the surface may be reduced by less than 3%, such as by less than 5% such as by less than 10% after subjecting the mold to more than 500 molding cycles, such as more than 5000 molding cycles, such as after subjecting the mold to more than 10.000 molding cycles.

The properties of the silane based coating layer typically improves the anti-stiction between the mold and the molding material, such as the stiction between the at least one surface of the mold and the molding material. When the stiction is reduced, the demolding is typically improved and furthermore, a significantly improved reproducibility has been obtained with a silane, halogenated silane or perfluoro silane, coated surface. It is an advantage that due to the reduced stiction of the silane coated mold having advanced surface structures and using different materials may be molded. This includes molding, such as injection molding, of polymers having a low shrinkage. Such polymers may typically not otherwise be molded in a mold cavity, as the shrinkage with cooling is insufficient to allow the formed element to demold.

Using the anti-stiction coating according to the present invention may allow for formation of irregular shaped objects, such as objects having asymmetrical designs, such as free form shaped objects, such as objects having a complex shape, such as object shapes being concurrently formed along a plurality of object sides, such as for example objects having an undercut when viewed from above, such as for example objects comprising at least one surface in a horizontal direction and at least one surface in a direction at an angle to the horizontal direction, such as in a vertical direction, wherein both surfaces are shaped during the molding process. For example, both surfaces may have cavities, such as undercuts, cut-ins, such as concave or convex shapes, etc. Hereby any objects, such as window frames, syringes, functional nanostructures, etc. may be formed in aluminum molds without requiring the application of an anti-stiction agent in between molding cycles. Thus, also macro objects, such as objects having at least one dimension being larger than 5 cm, such as larger than 10 cm may be formed using the inventive mold.

Advanced mold surface structures may include molds for the formation of nano structures, such as mold surfaces having tall surface structures, such as surfaces exhibiting nano sized features, such as molds for nano grass, molds for "black silicon", molds with a combination of nano- and micro structures, such as molds with a combination of nano- and micro structures for e.g. superhydrofobic parts. The mold cavity surface may thus have a negative "black surface" morphology or a negative nano-grass morphology, etc.

This coating may thus be a thin, sub-nanometer monolayer, the coating may be highly controllable and may bond covalently to the surface. Preferably, the silane coating is created as self-assembled monolayers on a surface when a molecular vapor of precursor chemicals is present. In the case of FDTS, the chlorine atoms in the end of a fluorinated organosilane react with hydroxyl (—OH) groups of the metal oxide surface to form a chemical bond under elimination of HCl. This forms a monolayer of anti-stiction coating that has a contact angle of e.g. 100°-120°, such as 105°-115° with water.

The anti-stiction coating may comprise molecular chains which are covalently bonded to the at least one surface, i.e. to the aluminum surface, and each molecular chain may comprise at least one halogenide-containing group, e.g. such as at least one fluorine containing group.

Typically, the at least one coated surface may have a contact angle with water above 100°, such as between 100° and 120°, such as between 105° and 115°.

Furthermore, the reduction of the contact angle for water, such as the sessile drop contact angle, after the at least one surface has been subjected to a number of injection molding cycles, may provide an indication of the wear and tear of the anti-stiction coating. It has been found by the present inventors that a reduction of water contact angle on the at least one coated surface after subjecting the mold to at least 500, such as at least 1000, such as at least 5000, such as at least 7500, such as at least 10,000, injection molding cycles is less than 15 degrees, such as less than 12 degrees, such as less than 10 degrees. Thus, the water contact angle on the coated surface may be reduced to between 85° and 105° after the mold have been subjected to more than 1000 injection molding cycles.

It is an advantage of the present invention that the properties of the anti-stiction coating largely withstand harsh injection molding cycling with high pressure and repeated temperature loading.

The at least one surface with anti-stiction coating may have a surface energy below 20 mN/m, such as below 25 mN/m, such as below 30 mN/m. In one or more embodiments, a reduction of surface energy on the at least one coated surface after subjecting the mold to a plurality of injection molding cycles is less than 10 mN/m.

Furthermore, the surface energy may be reduced by less than 10 mN/m, such as by less than 5 mN/m after 500 injection molding cycles, such as after 1000, such as after 3000, such as after 5000 injection molding cycles.

The mold may be formed in an aluminium material comprising at least 50 wt % aluminium. Typically, aluminium alloys have 15-25% alloy material, and 75-85 wt % aluminium. Due to aluminium's thermal properties, the use of aluminium and aluminium alloy molds ensures a good, rapid heat distribution and dissipation in the molding process. Aluminium has furthermore a low density and good machinability and is, thus, lighter than for example steel, easier to manufacture, and the aluminium molds may both cut faster and erode faster than their steel counterparts. However, it is important that the thermal properties of aluminium are not sacrificed due to a thick coating of a material having a higher coefficient of thermal conductivity.

For aluminium and aluminium alloys a dense, strongly adhering oxide layer may be formed on the surface of the aluminium in the presence of atmospheric oxygen. Thus, in one embodiment, a thin film aluminium oxide may be formed on the at least one surface of the cavity prior to coating. The thin film aluminium oxide may be deposited using any known methods, such a CVD process, a PE-CVD process, etc., or the thin film may be a native oxide layer. Typically, such a native oxide layer or film has a thickness of a few nanometers. The deposited thin film aluminium oxide may have a thickness of between 1 nm and 100 nm.

Also for other materials than aluminum a thin film oxide or corresponding intermediate layer may be provided, such as by deposition, for example to improve the bonding of anti-stiction coating to the at least one surface. The mold material, such as the aluminium material, may be a high-strength aluminium alloy, such as an aluminium material selected from a group of materials comprising: aluminium alloys, high-strength aluminium, high-strength aluminium alloys, aluminium-zinc-magnesium-copper alloys, rapid quenched aluminium, aluminium alloys containing Si, Fe, Mg, Cu, Zn, Cr, Mn and/or Hf elements. The aluminium material may further be special aluminium alloys such as RSA6061, aluminium alloys containing iron related particles (Fe,Mn,Cr)3SiAl12 and (Fe,Mn,Cr)2Si2Al9 together with Mg2Si particles. The aluminium material may be an aluminium alloy formed by using a rapid solidification process to both increase solid solubility of added elements and to improve mechanical properties. The mechanical properties may in this way be improved by solute strengthening and precipitate strengthening, by refinement of matrix grain size and fine grain strengthening, and by formation of new meta-stable phases of the aluminium material.

Aluminium, and aluminium containing, molds may be manufactured using a number of techniques including CNC machining, electro plating, Electric Discharge Machining, EDM, micromachining, laser machining etc.

The aluminium mold may have a mold geometry for defining the shape of the cavity and thus of the finished mold element, i.e. the replica.

The molds formed in aluminium material may be manufactured to provide for replication of small features, and may have at least one feature smaller than 1 μm, such as at least one feature smaller than 500 nm, such as at least one feature between 1 nm and 500 nm. The small features may comprise protrusions and/or indentations or wells, such as wells being narrower than 500 nm, but may be deeper than 1 micron, wells being shallower than 500 nm, protrusions being thinner than 500 nm, etc. The present invention is especially advantageous for molds having such small features.

The at least one surface of the at least one cavity, which may form at least a part of a mold geometry, may have at least one feature being between 1 nm and 500 nm.

The mold according to the present invention may be configured to reproduce elements such as all-polymer micro fluidic systems, micro fluidic system having integrated nanostructures, such as integrated nanostructures configured for cell handling or the mold may be configured to reproduce elements having nanostructure surfaces for reducing the reflection of light, such as "black" surfaces, etc.

The mold may be used for a plurality of molding process, and the mold may be an injection molding mold, a blow molding mold, a reaction injection molding mold or a rotational molding mold. The mold may further be an extrusion molding die. The mold may be used at room temperature, or the mold may be heated during processing.

The mold may be configured to receive a molding material being a polymer and the polymer may be any polymer typically used in molding processes as mention above, such as and not by means of limitation polyethylene, polystyrene, high density poly ethylene (HDPE), low density poly ethylene (LDPE), nylon, acrylonitrile-butadiene-styrene (ABS), etc. The molding material may be thermosetting plastic materials and/or thermoplastic materials. The injection molding may be performed with any materials suitable for injection molding, including elastomers, polymers, such as thermoplastic polymers and/or thermosetting polymers, metals, glasses, etc. in liquid or solid forms.

In one or more embodiments, the mold may be configured to receive a polyurethane (PUR) material. Polyurethane molding is characterized by injecting two or more components into the mold and the objects are molded using a low pressure reaction injection molding. The two or more components injected typically have extremely low viscosity during injection, and hence the mold preferably needs to be very tight, i.e. preferably the mold is fabricated with very narrow tolerances. It is an advantage of using an anti-stiction coating according to the present invention in that the tolerances of the mold may be controlled, and that no, or substantially no, leaks occur during molding due to application of release agents using e.g. spraying or brushing.

The mold may be especially manufactured to be used with any of the molding processes as mentioned above. For example, a mold for injection molding may be an injection molding mold further comprising air vents, ejector pins and/or at least one injection nozzle for injection of the molding material into the at least one cavity. The mold may also be configured for blow molding further having an air intake for pressurized air. The mold may comprise more than one part, such as two, three, four parts, etc., and the parts may be configured to be in close proximity, such as clamped together, for example such as clamped together in a press which clamps the molds closed, during a process to form a molded element, and typically, the mold parts are opened to allow for release of the mold element.

More than one cavity may be defined by the mold, such as two, three or four cavities, etc., and the mold may comprise one or more mold inserts to be inserted into blocks. The blocks and the mold inserts may both be in an aluminium material, or the blocks may be formed in another material, such as steel, such as stainless steel. Preferable, the substantially closed cavity is formed in the aluminium material so that the at least one surface is a surface of the aluminum material, such as in aluminium mold inserts and it is preferred that the surfaces of the cavity are aluminium surfaces. The geometry of the cavity may defined by the geometry of the inserts.

The mold may be configured to form at least one substantially closed cavity defined by inner surfaces of the aluminum mold for receiving an injection molding material during molding. For example, the mold may comprise at least two parts, such as an upper mold part and a lower mold part, and the upper mold part and the lower mold part may be configured to be clamped or otherwise connected during molding, for example by using a clamping unit, such as a unit configured to open and close the mold and to eject molded objects or parts.

A substantially closed cavity may thereby be formed in between the upper mold part and the lower mold part when the upper mold part and the lower mold part are clamped together during a molding process. The upper mold part and/or the lower mold part may comprise at least one hollow structure, such as at least one cavity, provided on at least one inner surface of the mold. The upper mold part and/or the lower mold part may further have a pattern structure exhibiting for example small features.

The mold may be configured for molding at temperatures above $T_g$ for the molding material, typically between 70° C. and 150° C., and up to 370° C., such as for molding around 200° C., such as configured for injection molding at temperatures between 70° C. and 200° C.

The injection molding material may be fed into an injection barrel and injected into the substantially closed cavity via an injection nozzle. The injection molding material is allowed to cool and harden inside the cavity to form an object having the shape of the substantially closed cavity before the object is released from the mold.

The barrel may be heated to a temperature of between 25° C. to 300° C., such as between 100° C. to 300° C., such as between 150° C. and 300° C., such as between 150° C. and 250° C., between 100° C. to 150° C., between 200° C. to 300° C., such as about 200° C., or about 250° C.

For injection molding, the polymers are heated to a temperature where the polymer flows, typically, higher temperatures are used for filling smaller features in the mold. The initial temperature of the polymer may be around 200° C., and the temperature may rise to above 350° C. during injection molding, the additional heat being induced by high viscosity flow.

During the molding process, the polymers are allowed to cool and harden in the injection molding mold before being ejected from the form. Thus, it is seen that the mold, and especially the inner surfaces of the mold, such as the at least one surface, are temperature cycled with each mold cycle, such as from 200° C., and up to e.g. 350° C. and down to room temperature such as 25° C., or to 50° C. This temperature cycling is a harsh test for the molds, and any coatings applied to the molds.

Typically, the injection molding material is injected into the mold using a high pressure, such as a pressure above 1 MPa, such as above 100 MPa. The applied force to the injection material may typically be between 100 MPa and 350 MPa, such as between 150 MPa and 350 MPa, such as between 150 MPa and 300 MPa, such as between 175 MPa and 250 MPa, such as about 200 MPa.

The step of subjecting the at least one surface to a gas or liquid phase silane to thereby form an anti-stiction coating may comprise using a molecular vapor deposition process (MVD) to deposit the anti-stiction coating.

Alternatively, any other process as known to a person skilled in the art may be used to form the anti-stiction coating.

During formation of the anti-stiction coating, an $H_2O$ vapor may be introduced to the process to react with the halogenated silane gas during deposition. The $H_2O$ vapor may be introduced into the MVD reaction chamber at a pressure above 100 Pa, such as above 130 Pa, such as at or about 130 Pa.

The method of preparing the aluminum mold may further comprise the step of inserting the aluminum mold into injection molding machinery.

In another aspect of the present invention, a process of coating a mold is provided, the mold being formed in an aluminium material comprising at least 50 wt % aluminium and having at least one aluminium surface, wherein the at least one aluminium surface is exposed to gas or liquid phase silane to thereby form a silane based coating layer. In one embodiment, the at least one aluminium surface may be provided in a Molecular Vapour Deposition chamber and coated with a perfluorosilane layer using a low temperature molecular vapour deposition process.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. Like elements will, thus, not be described in detail with respect to the description of each figure.

DETAILED DESCRIPTION OF THE DRAWINGS

Molds may be highly complex in shape and dimension, and molds may define a number of cavities to allow for reproducibility of complex elements. By way of example only, the following drawings shows simplified molds, cavity numbers, cavity shapes and mold images for illustration of the principles only. It is envisaged that also more complex molds, cavity shapes and mold images may be used with the present invention. Typically, the one or more cavities form a substantially closed cavity to allow for molding of liquid material.

Figure 1A:
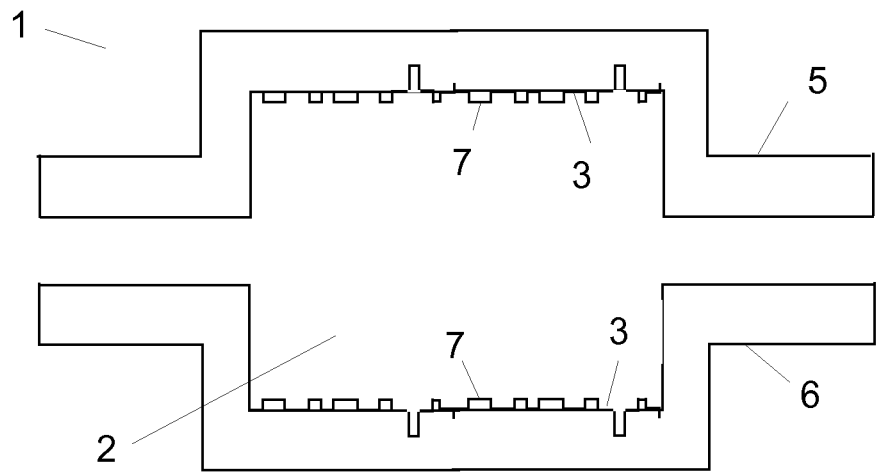
FIG. 1a shows schematically a two-part mold having a cavity.

In FIG. 1a, a schematic drawing of a mold 1 having a closed cavity 2 is provided. The mold may be used for a number of molding processes. At least one surface 3, such as an inner surface of the mold, of the at least one cavity being an aluminium surface coated with a silane based anti-stiction coating 4 (see FIG. 1b). The mold 1 is formed in an aluminium material comprising at least 50 wt % aluminium and the closed cavity 2 is configured to receive a molding material. The mold is a two-part mold having two parts 5 and 6. The parts 5, 6 are typically positioned in a press for molding wherein the two parts are clamped together during the molding process, such as during an injection molding process, a blow molding process, etc. A mold geometry or pattern 7 is provided in a surface 3 of the cavity, i.e. at an inner surface 3 of the mold 1.

Figure 1B:
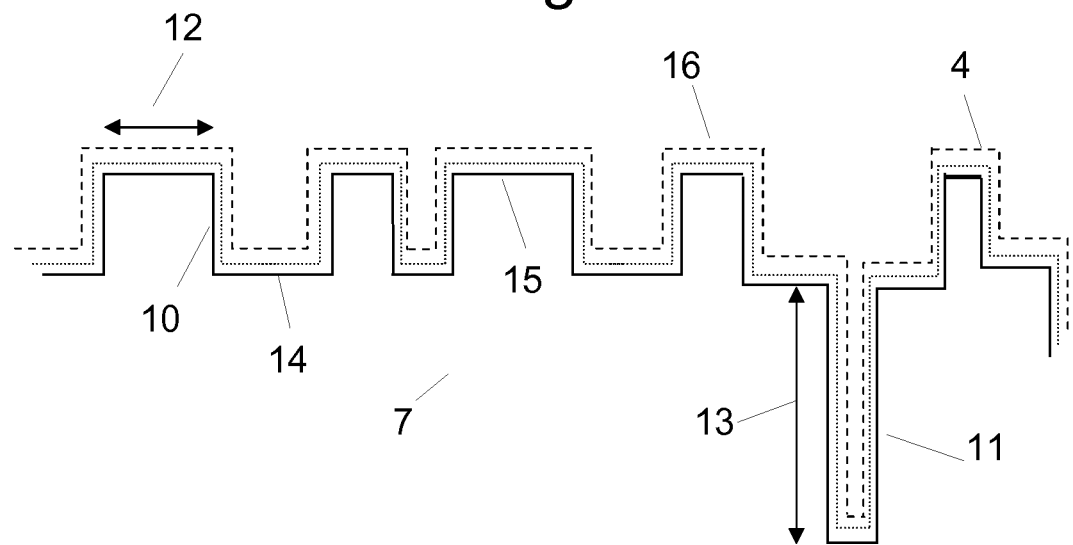
FIG. 1b shows schematically a cavity surface structure.

The pattern 7 may be configured to provide for replication of small features, and may have at least one feature smaller than 1 µm. An expanded view of such a pattern is shown in FIG. 1b. The width 12 of the protrusions 10 may for example be smaller that 500 nm and the depth 13 of the well 11 may be deeper than 1 micron and still having a width narrower than 500 nm.

As is seen in FIG. 1b, the aluminium surface 14 has an oxide layer 15 and a silane anti-stiction coating 16. The oxide layer 15 may be a native oxide, or it may be a thin deposited oxide layer to ensure a good and uniform oxide layer over the aluminium surface. The anti-stiction coating, such as a silane layer, bonds to the oxide layer and a homogenous coating is ensured. The silane coating is typically created as self-assembled monolayers on the oxidized aluminium surface when a molecular vapor of precursor chemicals is present.

It is preferred that the at least one surface of the at least one cavity, which may form at least a part of a mold geometry, may have at least one feature being between 1 nm and 500 nm.

Figure 2:
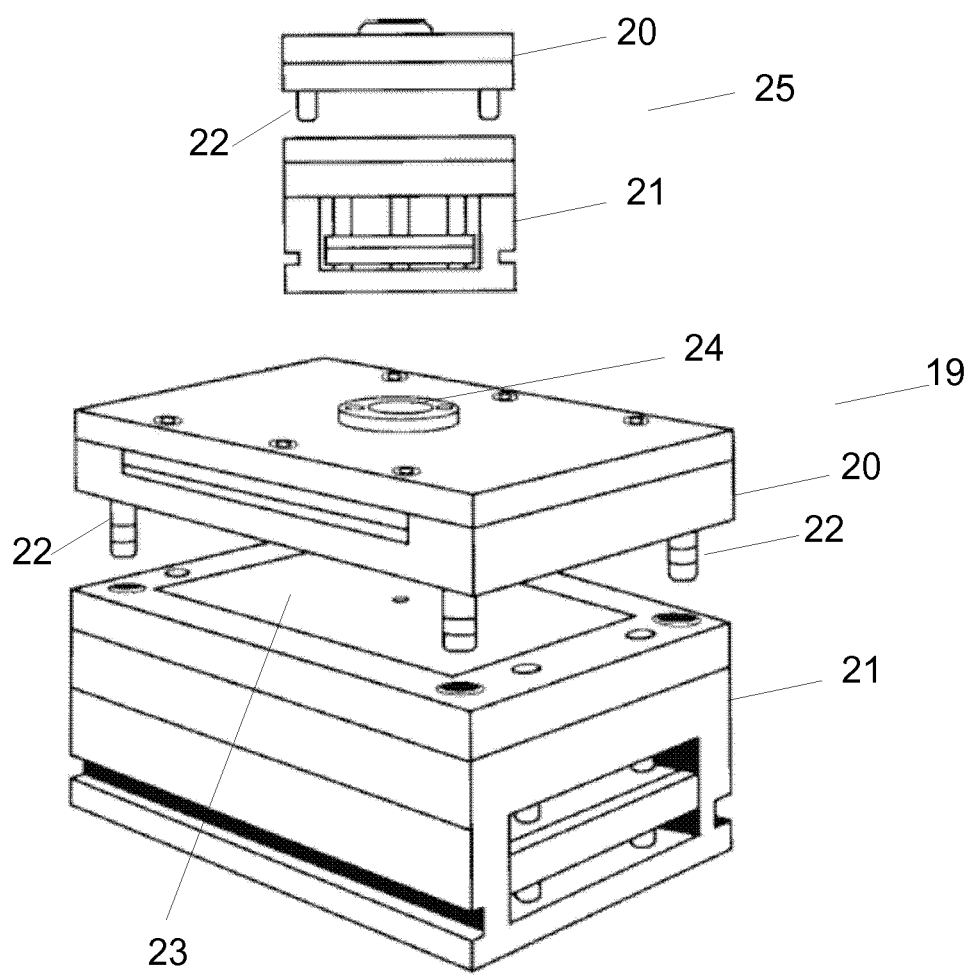
FIG. 2 shows an isometric view of an injection mold assembly.

FIG. 2 shows an isometric view of an injection mold assembly 19. 25 shows a view from the side of the mold, having a top mold part 20 and a bottom mold part 21, with a cavity formed between the top mold part 20 and the bottom mold part when connected. Guiding pins 22 ensures correct assembly of the mold. 19 shows an elevated view of the injection mold assembly, and an inner surface 23 of the mold, i.e. a cavity surface 23 is shown. The surface is an aluminium surface and coated with a silane coating. The inlet 24 allows for injection of the melt into the cavity during molding.

To test the coating, an Injection molding to test wear stability was done using an Engel Victory 200/55 machine, with more than 500 injection molding cycles, i.e. injection molding cycles. First, 300 test cycles using clear Polystyrene (Total Petrochemicals) material at a mold temperature of 20° C. and a melt temperature of 250° C. were performed, and then additionally more than 200 cycles with proprietary yellow ABS material at a mold temperature of 90° C. and a melt temperature of 320-340° C. were performed.

Also, the temporal stability of the coating on a mold was tested by leaving it exposed for more than 7 months at ambient conditions with exposure to direct sunlight, humidity and air pollution and there was no observable degradation of coating after seven months exposure to ambient conditions.

Figure 3:
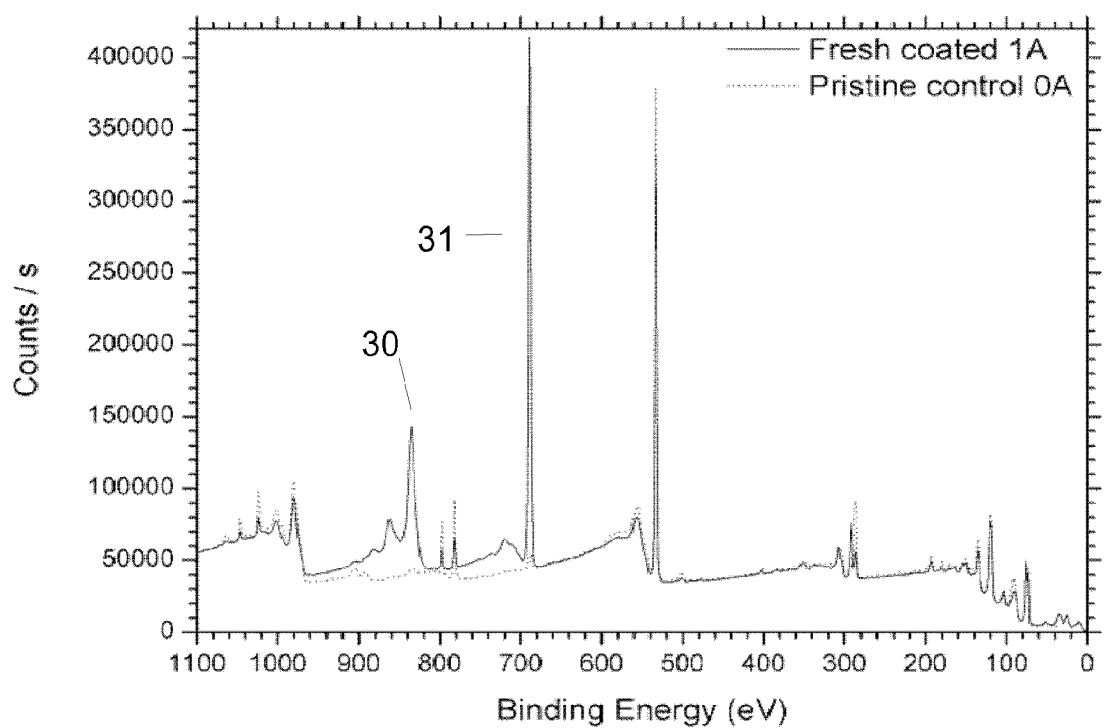
FIG. 3 shows an XPS survey spectra of coated and uncoated surfaces.

FIG. 3 shows an XPS survey of an FDTS coated aluminium mold compared with a pristine control. Elemental analysis from the XPS survey spectra shows strong presence of Fluorine on freshly coated samples in comparison to uncoated controls, i.e. a peak in binding energy around 960 eV, 30, and 700 eV, 31. This indicates that XPS is a well suited method to evaluate coating state.

Furthermore, the surface of pristine, uncoated control sample has been compared with the surface of a sample freshly coated by FDTS and with the surface of a sample after more than 500 injection molding cycles have been performed. Stylus profiler data show no significant change in surface morphology and roughness, which is in accordance with the monolayer character of perfluorodecyl-trichlorosilane coating on the hydroxyl terminated aluminium oxide surface.

Elemental quantification shows fluorine concentration of 29.8% at on freshly coated surface and only slightly lower concentration on the post-IM mold surface, with 27.6% at. as shown in Table 1. This demonstrates that FDTS coating prevails well in harsh conditions of molding, and specifically injection molding. Table 1:

| Name | Peak BE | FWHM eV | At % |
| --- | --- | --- | --- |
| O1s | 531.04 | 3.34 | 44.6 |
| Al2p | 72.32 | 5.11 | 34.19 |
| C1s | 284.44 | 3.17 | 19.44 |
| F1s | 685.07 | 3.83 | 1.77 |
| O1s | 533.14 | 3.21 | 31.62 |
| Al2p | 75.54 | 5.09 | 26.78 |

| Name | Peak BE | FWHM eV | At % |
|---|---|---|---|
| C1s | 292.17 | 2.72 | 11.78 |
| F1s | 689.76 | 2.95 | 29.82 |
| O1s | 534.01 | 3.23 | 29.25 |
| Al2p | 75.88 | 4.76 | 19.13 |
| C1s | 287.17 | 2.98 | 24.03 |
| F1s | 690.77 | 2.56 | 27.59 |

Figure 4:
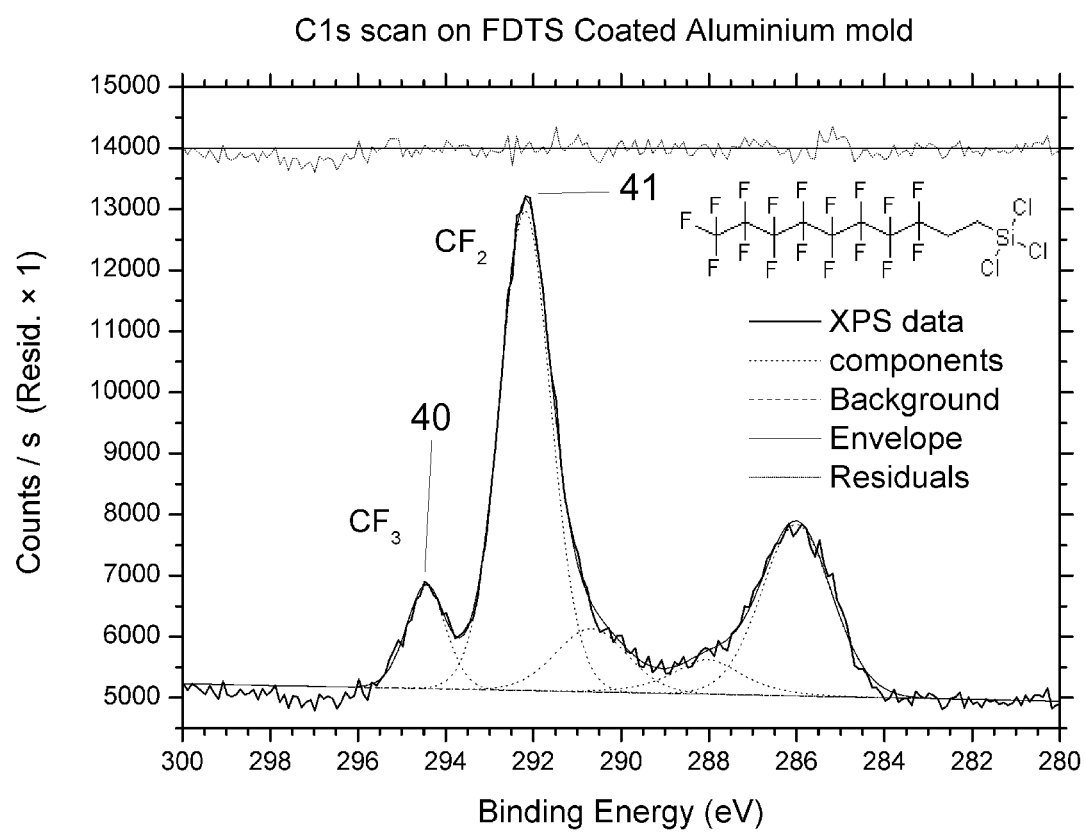
FIG. 4 shows a deconvoluted C1s photoelectron spectrum

A deconvolution of C1s core level spectra is shown in FIG. 4. This spectra reveals prominent high binding energy (BE) peak components at 294.47 eV, 40, and 292.13 eV, 41, with FWHM of 1.04 and 1.48 eV, respectively. Those high binding energy components may be attributed to functional —CF2- and —CF3 groups in an FDTS molecule. The ratio of peak areas is 6.89, very close to 7 as expected from structure of the FDTS molecule shown in insert of FIG. 4. This can serve as a specific fingerprint of FDTS coating presence. The insert shows the structure of an FDTS molecule having a long chain of fluorine and the end is a silane connected to three chlorine atoms.

Thus, the XPS spectral survey data shows the presence of Fluorine in both coated and post injection-molding samples and the high resolution Carbon 1s spectra identifies fluorine molecules as expected. Covalently bonded FDTS coating molecules seems to be particular advantageous in multiple injection molding cycles.

A Krüss DSA 100S Drop Shape Analyzer has been used to analyze the shapes of sessile drops of liquid on sample surfaces. 3 liquids have been used for testing, namely water, benzylalcohol and diiodomethane to provide sufficient number of pairs for good calculation of surface energy. Angles have been extracted 12 times from each drop in the first 6 seconds after deposition, with 4-10 good drops on each surface for each fluid. The surface morphology was tested by Dektak 8 stylus profiler from Veeco Instruments.

Figure 5:
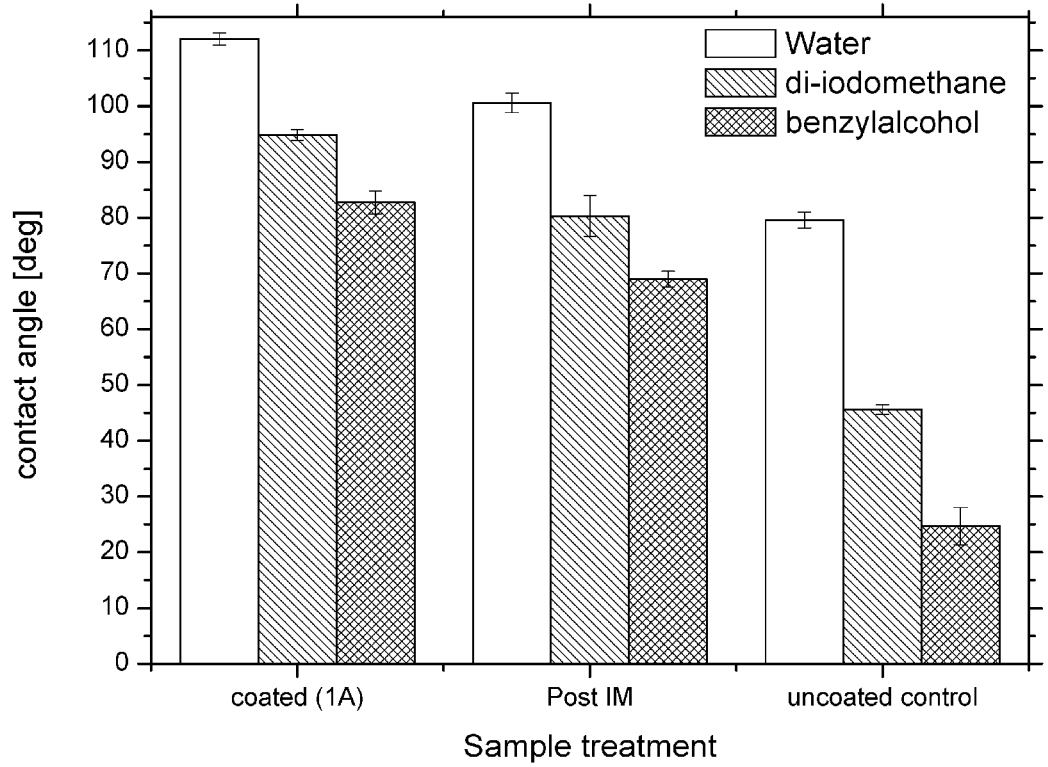
FIG. 5 shows contact angle measurements for liquids on coated aluminium molds.

FIG. 5 shows the contact angle measurement results for the three different liquids as a function of sample treatment. The sessile drop contact angle (CA) was measured on multiple locations of the sample to account for possible heterogeneities. Each fluid drop was reproduced between 4-10 times and measured 12 times in first 6 seconds. As is usual, obvious outliers have been excluded and variance was calculated from remaining contact angle values for each liquid and this summary result is shown in FIG. 5.

The sessile drop contact angle results show that FDTS coating reduces the surface energy 2.5 to 3.3 times and this modification largely withstand harsh injection molding cycling with high pressure and repeated temperature loading.

Figure 6:
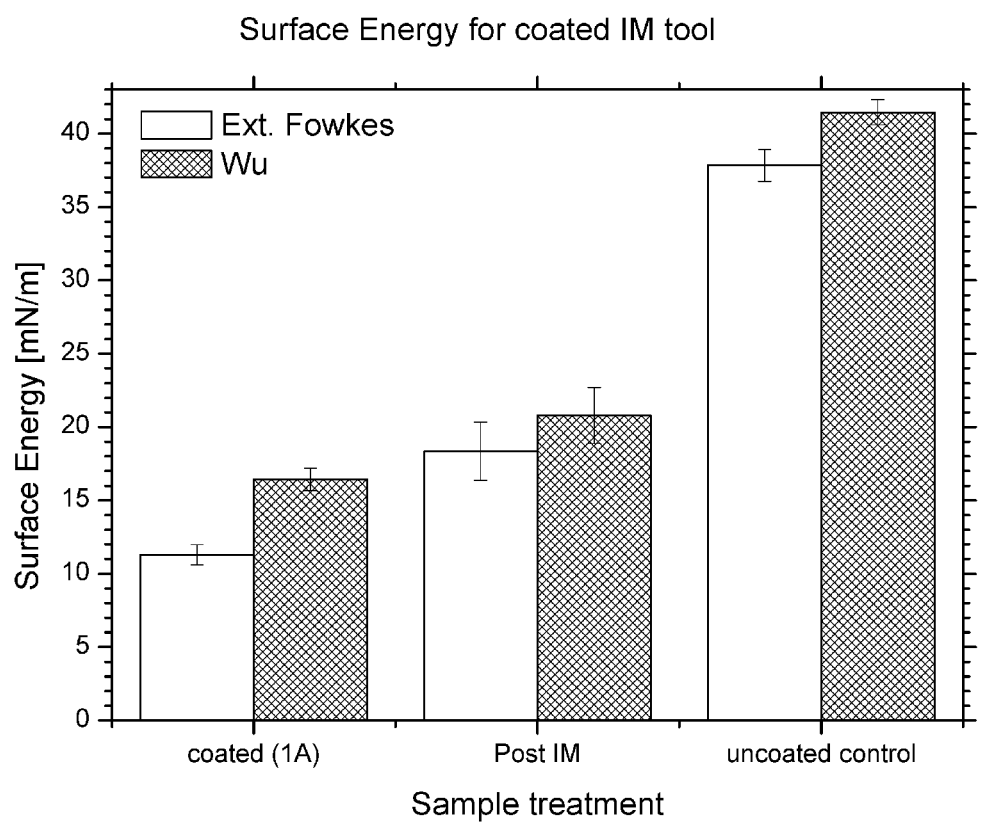
FIG. 6 shows surface energy measurements (stiction properties) of treated surfaces.

FIG. 6 shows surface energy calculation result using pairs of liquids, according to Wu and Fowkes methods. This shows dramatic decrease in surface energy after coating and survival of this surface modification at over 500 IM cycles. Extracted error weighted contact angle data have been used to calculate the surface energies according to the extended Fowkes and Wu methods, as set out in e.g. S. Wu, J. Polym. Sci., Part C: Polym. Symp. (1971) 19, using fluid pairs and as know to a person skilled in the art.

Figure 7:
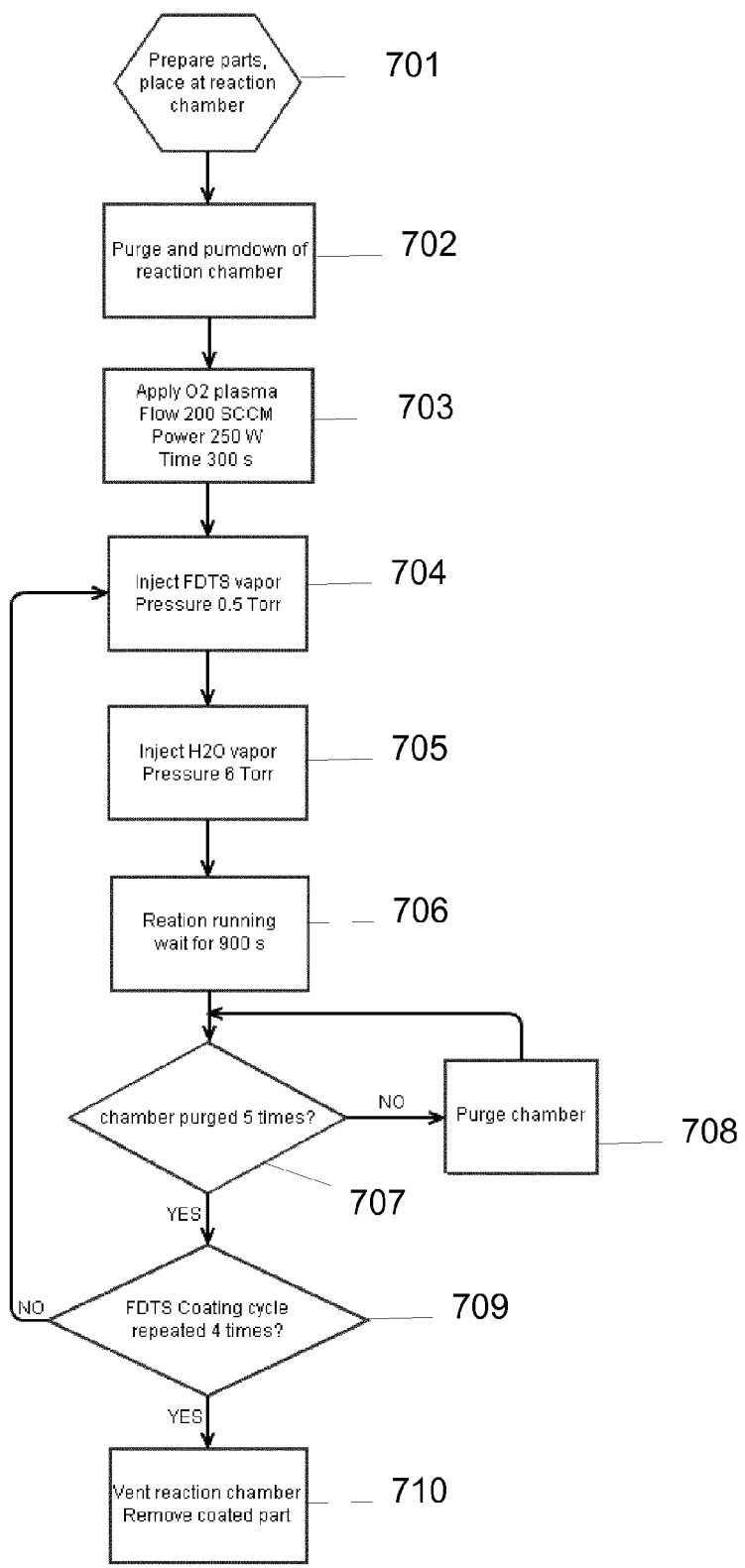
FIG. 7 shows a flow chart of a coating process for an FDTS coating process.

In FIG. 7, a flow chart describing a molecular vacuum deposition coating process is shown. The process starts with step 701, the parts are prepared, e.g. by cleaning, and placed in the reaction chamber. In step 702, the reaction chamber is purged and pumped down. A flow is established in the chamber in step 703, wherein an $O_2$ plasma is applied. In this embodiment, the flow is 200 sccm, the power is 250 W and the time is 300 s. This step is optional and ensures a uniform aluminium oxide coating of the parts. The main cycle for depositing a silane layer starts in step 704 where FDTS vapour is injected into the chamber. In the present embodiment, the pressure is 0.5 Torr. In step 705 $H_2O$ vapour is injected, and in the present embodiment, the pressure of the $H_2O$ vapour is 6 Torr. In step 706, the reaction is running. In the present embodiment, the time wait is 900 seconds. In step 707, the gas valves are closed. If the chamber has not been purged, in the present embodiment, 5 times, the chamber is purged again in step 708. This process is repeated till the chamber has been purged 5 times.

In step 709, it is checked whether the coating cycle has been repeated four times. If this is not the case, the process is repeated from step 704. If the coating cycle has been repeated four times, the process is advanced to step 710, wherein the reaction chamber is vented, and the coated part removed.

In a specific embodiment, an FTDS monolayer coating was deposited using a commercial MVD 100 system from Applied Microstructures and multi-cycle recipe. The chemicals were heated to about 50° C. while the sample was kept at approx. 35° C. The process was started by an $O_2$ plasma with 200 sccm flow at 250 Watts power for 300 seconds. This cleans and primes the surface, and ensures that exposed aluminium is coated with aluminium oxide.

The main cycle for depositing the FDTS coating comprises 4 releases of FDTS at 0.5 Torr, 1 release of water vapour at 18 Torr and 900 seconds of reaction time. The cycle ends with 5 purge steps. The main cycle was repeated 4 times, resulting in total processing time of approximately 80 minutes for depositing the silane coating. It is envisaged that this is one preferred method of depositing the silane coating while there are numerous other methods available as known by a person skilled in the art, both with respect to the method used and with respect to the process parameters selected in the MVD process.

After the coating process, the mold or the mold insert is placed in an injection molding machinery, and the mold parts, or the blocks with mold inserts, are clamped together to ready the molding machinery for molding.

Figure 8:
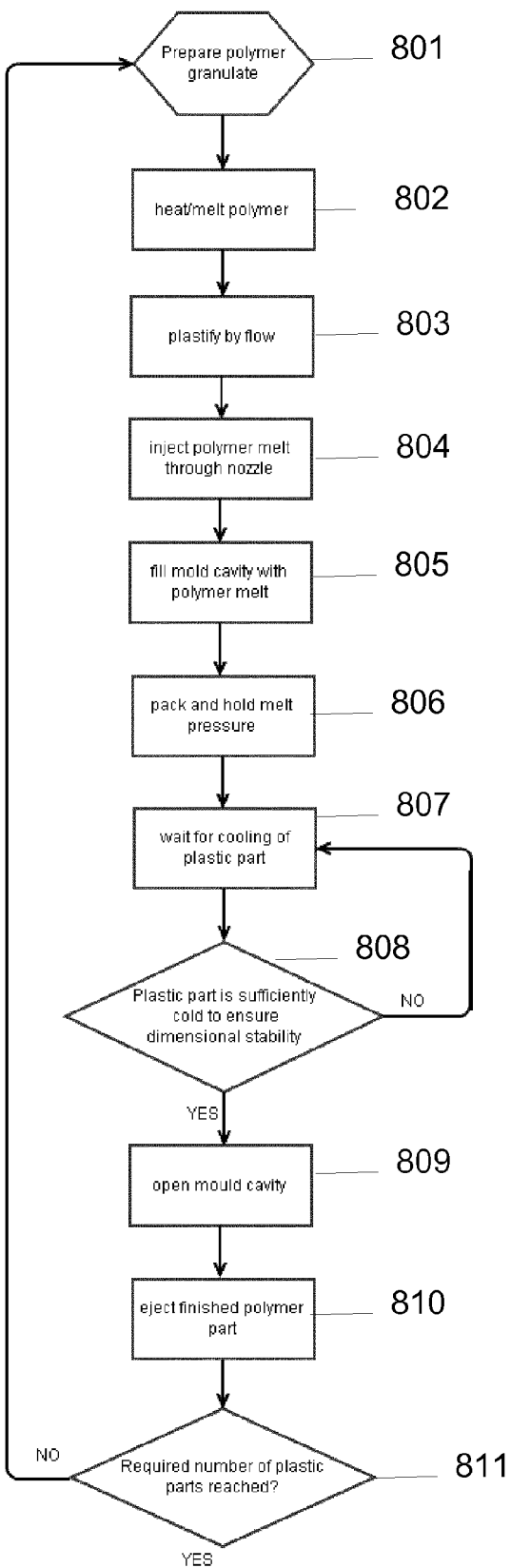
FIG. 8 shows a flow chart of an injection molding method

FIG. 8 shows a flow chart describing a conventional injection molding process in which a mold according to the present invention may be used. The injection mold process starts in step 801 with the preparation of a polymer granulate, the granulate is heated/melted in step 802, and plasticized by flow in step 803. The polymer melt is injected in the mold cavity through an injection nozzle in step 804. As the present molding method is an injection molding, the closed cavity is filled with polymer melt in step 805. It is envisaged that for e.g. blow molding or extrusion molding, etc, the cavity need not be fully filled with the molded melt. In step 806, the polymer is packed and the melt pressure is held. In step 807, a wait is performed, waiting for the cooling of the polymer part. In step 808 a check is performed whether the polymer part is sufficiently cold to ensure dimensional stability. If not, the wait in step 807 is repeated, if affirmative, the process is continued. In step 809, the mold cavity is opened and in step 810 the finished polymer part is ejected. The process is typically performed repeatedly as indicated in step 811, until the required number of plastic elements/replicas has been reached.

It is an advantage of using a silane coating, such as FDTS, that the tool and/or mold surfaces may be easily cleaned, primed by oxygen plasma and recoated with a new silane layer. Thus, it is easy to both repair and renew the coating. A mechanical removal of the coating before a new coating can be applied is not necessary and a renewed coating may not affect surface finish, texture and smoothness.

The invention claimed is:

1. A method of preparing an aluminum injection molding mold for injection molding, the method comprising the steps of:
    providing an aluminum mold having a least one surface; and
    subjecting the at least one surface to a gas or liquid phase silane to thereby form an anti-stiction coating, the anti-stiction coating comprising a chemically bonded monolayer of silane compounds on the at least one surface,
    wherein the at least one surface coated with the anti-stiction coating is configured to withstand an injection molding process at a pressure above 100 MPa and wherein the silane is a halogenated silane, and
    wherein the step of subjecting the at least one surface to a gas or liquid phase silane comprises a molecular vapor deposition process (MVD), and $H_2O$ vapor at a pressure above 130 Pa is introduced into the MVD process.

2. A method according to claim 1, wherein the halogenated silane is a fluoro silane, a perfluorosilane, a chloro silane, a perchloro silane, a bromine silane or an iodine silane.

3. A method according to claim 1, wherein the silane is perfluorodecyltrichlorosilanes (FDTS), undecenyl trichlorosilanes (UTS), vinyl trichlorosilanes (VTS), decyl trichlorosilanes (DTS), octadecyltrichlorosilanes (OTS), dimethyldichlorosilanes (DDMS), dodecenyltricholrosi lanes (DDTS), fluorotetrahydrooctyldimefhylchlorosilanes (FOTS), perfluorooctyldimethylchlorosilanes aminopropylmefhoxysilanes (APTMS), fluoropropylmethyldichlorosilanes, perfluorodecyldimethylchlorosilanes.

4. A method according to claim 1, wherein the halogenide content on the at least one coated surface is at least 30%.

5. A method according to claim 1, wherein the at least one coated surface has a surface energy below 20 mN/m.

6. A method according to claim 5, wherein a reduction of surface energy on the at least one coated surface after subjecting the mold to injection molding cycles is less than 10 mN/m.

7. A method according to claim 6, wherein the surface energy reduction is less than 10 mN/m after 5000 injection molding cycles.

8. A method according to claim 1, wherein the chemically bonded monolayer of silane compounds is configured to withstand at least 1000 injection molding cycles.

9. A method according to claim 1, wherein the anti-stiction coating consists of the silane coating.

10. A method according to claim 1, wherein the anti-stiction coating has a thickness between 1 Å and 40 nm.

11. A method according to claim 1, wherein the at least one coated surface has a contact angle for water above 100 degrees.

12. A method according to claim 11, wherein a reduction of water contact angle on the at least one coated surface after subjecting the mold to at least 1000 injection molding cycles is less than 15 degrees.

13. A method according to claim 1, wherein the mold is being configured to form at least one substantially closed cavity defined by inner surfaces of the aluminum mold for receiving an injection molding material during molding.

14. A method according to claim 1, wherein the method of preparing the aluminum mold further comprises the step of inserting the aluminum mold into injection molding machinery.

15. A method according to claim 1, wherein a thin film aluminum oxide is formed on the at least one surface prior to coating.

16. A method according to claim 15, wherein the thin film aluminum oxide is a native oxide.

* * * * *